US008624259B2

(12) United States Patent
Lee et al.

(10) Patent No.: US 8,624,259 B2
(45) Date of Patent: Jan. 7, 2014

(54) ORGANIC LIGHT-EMITTING DISPLAY DEVICE

(75) Inventors: Yeon-Hwa Lee, Yongin (KR); Won-Jong Kim, Yongin (KR); Ji-Young Choung, Yongin (KR); Joon-Gu Lee, Yongin (KR); Darby Choi, Yongin (KR); Young-Woo Song, Yongin (KR); Jong-Hyuk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 13/244,135

(22) Filed: Sep. 23, 2011

(65) Prior Publication Data
US 2012/0181544 A1    Jul. 19, 2012

(30) Foreign Application Priority Data

Jan. 14, 2011   (KR) .................. 10-2011-0004088

(51) Int. Cl.
*H01L 27/14* (2006.01)

(52) U.S. Cl.
USPC ............ 257/72; 257/60; 257/66; 257/98; 257/E33.003; 257/E51.026; 313/504; 349/34; 385/123; 385/143; 345/80

(58) Field of Classification Search
USPC ........................................ 257/72, 760, 790
See application file for complete search history.

(56) References Cited

U.S. PATENT DOCUMENTS

| 7,544,534 | B2 * | 6/2009 | Lee et al. | 438/82 |
|---|---|---|---|---|
| 2005/0189535 | A1 * | 9/2005 | Hsueh et al. | 257/40 |
| 2006/0289872 | A1 * | 12/2006 | Miyazawa | 257/72 |
| 2007/0231503 | A1 * | 10/2007 | Hwang et al. | 428/1.1 |
| 2007/0248808 | A1 * | 10/2007 | Lee et al. | 428/319.1 |
| 2008/0272493 | A1 * | 11/2008 | Ko et al. | 257/760 |
| 2009/0261722 | A1 * | 10/2009 | Koo et al. | 313/504 |
| 2010/0001265 | A1 * | 1/2010 | Ahn et al. | 257/40 |
| 2010/0053044 | A1 * | 3/2010 | Lee et al. | 345/80 |
| 2010/0109013 | A1 * | 5/2010 | Ahn et al. | 257/72 |
| 2011/0042702 | A1 * | 2/2011 | Lim et al. | 257/98 |
| 2011/0133198 | A1 * | 6/2011 | Cho et al. | 257/66 |
| 2012/0062810 | A1 * | 3/2012 | Lee et al. | 349/34 |

FOREIGN PATENT DOCUMENTS

| JP | 2004-63466 | 2/2004 |
|---|---|---|
| KR | 10-2005-0051764 | 6/2005 |
| KR | 10-2005-0051765 | 6/2005 |
| KR | 1020050122894 A | 12/2005 |
| KR | 1020070050757 A | 5/2007 |
| KR | 1020070065094 A | 6/2007 |
| KR | 100832097 B1 | 5/2008 |

* cited by examiner

*Primary Examiner* — Jerome Jackson, Jr.
*Assistant Examiner* — Bo Fan
(74) *Attorney, Agent, or Firm* — Christie, Parker & Hale, LLP

(57) ABSTRACT

An organic light-emitting display device includes a substrate; a thin-film transistor on the substrate; a first insulating layer covering the thin-film transistor; a first electrode on the first insulating layer, and electrically connected to the thin-film transistor; a second insulating layer on the first insulating layer so as to cover the first electrode, and having an opening for exposing a part of the first electrode; a porous member in the second insulating layer; a second electrode on the second insulating layer, and facing the first electrode so as to correspond to the opening; and an organic emission layer between the first electrode and the second electrode so as to correspond to the opening. The organic light-emitting display device may prevent degradation of characteristics of an organic light-emitting device due to discharge of gas from an organic material.

6 Claims, 3 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2011-0004088, filed on Jan. 14, 2011, in the Korean Intellectual Property Office, the disclosure of which is incorporated herein in its entirety by reference.

BACKGROUND

1. Field

Aspects of one or more embodiments of the present invention relate to an organic light-emitting display device.

2. Description of the Related Art

Organic light-emitting display devices, which are self-emitting display devices that electrically excite an organic compound to emit light, have attracted much attention as next-generation display devices because the organic light-emitting display devices may be driven at a low voltage, may be easily made with a thin profile, and have advantages such as wide viewing angles, fast response speeds, etc., which are pointed out as problems in liquid crystal display (LCD) devices.

In the organic light-emitting display devices, pixels that emit light are divided by an insulating layer, e.g., a pixel-defining layer. The pixel-defining layer is mainly formed of an organic material, such as acryl, that discharges a gas in a baking process or in a driving process.

Such a gas may degrade characteristics of the organic light-emitting devices or exfoliate the pixel-defining layer.

SUMMARY

Aspects of embodiments according to the present invention are directed toward an organic light-emitting display device capable of preventing or reducing degradation of characteristics of an organic light-emitting device due to discharge of gas from an organic material.

According to an embodiment of the present invention, there is provided an organic light-emitting display device including: a substrate; a thin-film transistor on the substrate; a first insulating layer covering the thin-film transistor; a first electrode on the first insulating layer, and electrically connected to the thin-film transistor; a second insulating layer on the first insulating layer so as to cover the first electrode, and having an opening for exposing a part of the first electrode; a porous member in the second insulating layer; a second electrode on the second insulating layer, and facing the first electrode so as to correspond to the opening; and an organic emission layer between the first electrode and the second electrode so as to correspond to the opening.

The porous member may be on the first insulating layer.

Three surfaces of the porous member, except for a surface of the porous member contacting the first insulating layer, may contact the second insulating layer.

The porous member may surround the first electrode.

The porous member may continuously surround the first electrode.

The porous member may discontinuously surround the first electrode.

The porous member may be formed of an oxide or a carbide of a material selected from the group consisting of silicon (Si), titanium (Ti), aluminum (Al), zinc (Zn), and combinations thereof.

According to another embodiment of the present invention, there is provided an organic light-emitting display device including: a substrate; an organic emission unit on the substrate, and including a plurality of organic light-emitting devices; an insulating layer on the substrate; and a porous member in the insulating layer.

The porous member may be on the substrate.

Three surfaces of the porous member, except for a surface of the porous member contacting the substrate, may contact the insulating layer.

The porous member may surround the organic emission unit.

The porous member may continuously surround the first electrode.

The porous member may discontinuously surround the first electrode.

The porous member may be formed of an oxide or a carbide of a material selected from the group consisting of silicon (Si), titanium (Ti), aluminum (Al), zinc (Zn), and combinations thereof.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Now, exemplary embodiments according to the present invention will be described in detail with reference to the accompanying drawings.

Figure 1:
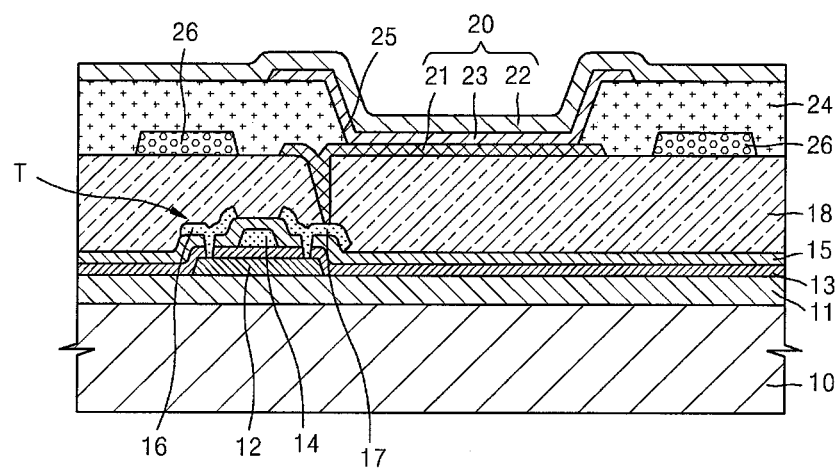
FIG. 1 is a cross-sectional view illustrating a pixel of an organic light-emitting display device, according to an embodiment of the present invention.

FIG. 1 is a cross-sectional view illustrating a pixel of an organic light-emitting display device, according to an embodiment of the present invention.

Referring to FIG. 1, the organic light-emitting display device includes a substrate 10, a buffer layer 11 formed on the substrate 10, and a thin-film transistor T formed on the buffer layer 11.

The buffer layer 11 may planarize a surface of the substrate 10 by reducing or preventing permeation of impurities therein. The buffer layer 11 may be formed of any suitable material. For example, the buffer layer 11 may be formed of an inorganic material such as silicon oxide, silicon nitride, silicon oxynitride, aluminum oxide, aluminum nitride, titanium oxide, or titanium nitride, an organic material such as polyimide, polyester, or acryl, or a combination thereof. In some embodiments, the buffer layer 11 may be omitted.

An active layer 12 formed of a semiconductor material may be patterned on the buffer layer 11. The active layer 12 may be formed of polycrystal silicon, but the present invention is not limited thereto, and thus, the active layer 12 may be formed of an oxide semiconductor. For example, the oxide semiconductor may be a G-I—Z—O layer [a $(In_2O_3)a(Ga_2O_3)b(ZnO)c$ layer], wherein a, b, and c are real numbers that satisfy conditions of $a≥0$, $b≥0$, and $c>0$, respectively.

A gate insulating layer 13 is formed on the buffer layer 11 so as to cover the active layer 12, and a gate electrode 14 is formed on the gate insulating layer 13.

An interlayer insulating layer 15 is formed on the gate insulating layer 13 so as to cover the gate electrode 14, and a source electrode 16 and a drain electrode 17 are formed on the interlayer insulating layer 15 and each contact the active layer 12 via a contact hole.

At least one thin-film transistor T having the above-described structure may be formed for each pixel.

The thin-film transistor T is covered by a first insulating layer 18. The first insulating layer 18 has a layered structure that has at least one layer that is formed on the interlayer insulating layer 15. The first insulating layer 18 may be formed of an organic material and/or an inorganic material. The organic material may be a polymer material such as acryl, polyimide, or polyester, and the inorganic material may be silicon oxide, silicon nitride, silicon oxynitride, aluminum oxide, aluminum nitride, titanium oxide, or titanium nitride.

A first electrode 21 is formed on the first insulating layer 18 and is connected to the drain electrode 17 via a via-hole formed in the first insulating layer 18.

A second insulating layer 24 is formed on the first insulating layer 18 and covers both edges of the first electrode 21. The second insulating layer 24 includes an opening 25 for exposing a part of the first electrode 21. The second insulating layer 24 may be formed of an organic material such as acryl, polyimide, or polyester, but the present invention is not limited thereto, and thus, the second insulating layer 24 may be formed of an inorganic material or a combination of an organic material and an inorganic material.

An organic emission layer 23 is formed on the first electrode 21 and the second insulating layer 24 so as to cover the part of the first electrode 21 exposed by the opening 25, and a second electrode 22 is formed on the organic emission layer 23 and the second insulating layer 24 so as to cover the organic emission layer 23.

The first electrode 21 is patterned for each pixel, and the second electrode 22 is formed as a common electrode so as to cover all the pixels.

The first electrode 21, the second electrode 22, and the organic emission layer 23 constitute an organic light-emitting device 20.

The first electrode 21 and the second electrode 22 may be formed to have opposite polarities. That is, the first electrode 21 and the second electrode 22 may be an anode and a cathode, respectively, or vice-versa.

An electrode functioning as an anode may include a conductor having a work function of a high absolute value, and an electrode functioning as a cathode may include a conductor having a low absolute value of a work function. The conductor having a work function of a high absolute value may be a transparent conductive oxide material such as indium tin oxide (ITO), $In_2O_3$, zinc oxide (ZnO), or indium zinc oxide (IZO), but the present invention is not limited thereto, and the conductor having a high absolute value of a work function may be a noble metal such as gold (Au). The conductor having a low absolute value of a work function may be silver (Ag), aluminum (Al), magnesium (Mg), lithium (Li), calcium (Ca), lithium fluoride (LiF)/Ca, or LiF/Al.

In a top emission type display, in which an image is displayed in an opposite direction of the substrate 10, the first electrode 21 may include a light reflector, and the second electrode 22 may be a light-transmitting type electrode.

Here, when the first electrode 21 functions as an anode, the light reflector may be formed of any one metal selected from the group consisting of Ag, Mg, Al, platinum (Pt), palladium (Pd), Au, Ni, neodymium (Nd), iridium (Ir), chromium (Cr), and combinations thereof, and ITO, IZO, ZnO, or $In_2O_3$ having a high work function is formed on the light reflector. When the first electrode 21 functions as a cathode, the light reflector may be formed of any one metal selected from the group consisting of Ag, Al, Mg, Li, Ca, LiF/Ca, LiF/Al, and combinations thereof that has a low work function and is a light reflective material.

When the second electrode 22 functions as a cathode, the second electrode 22 may have a thin profile so as to be a semi-permeable layer formed of any one metal selected from the group consisting of Li, Ca, LiF/Ca, LiF/Al, Al, Mg, or Ag having a low work function. A transparent conductor such as ITO, IZO, ZnO, or $In_2O_3$ may be formed on the semi-permeable layer, thereby solving a high resistance problem due to the thin thickness of the second electrode 22. When the second electrode 22 functions as an anode, the transparent conductor such as ITO, IZO, ZnO, or $In_2O_3$ may be formed on the second electrode 22.

Materials for forming the first electrode 21 and the second electrode 22 are not limited to those described above, and the first electrode 21 and the second electrode 22 may be formed of other different suitable materials within the scope that one of ordinary skill in the art would use.

The first electrode 21 and the second electrode 22 respectively apply voltages having opposite polarities to the organic emission layer 23 interposed therebetween so that light emission occurs at the organic emission layer 23.

The organic emission layer 23 may be formed of a low or high molecular organic material. When the organic emission layer 23 is a low molecular organic material, the organic emission layer 23 may be configured as a single-layer including a hole injection layer (HIL), a hole transport layer (HTL), an emission layer (EML), an electron transport layer (ETL), or an electron injection layer (EIL) or as a multi-layer including a combination thereof. The organic material may be copper phthalocyanine (CuPc), N,N'-Di(naphthalene-1-yl)-N, N'-diphenyl-benzidine (NPB), tris-8-hydroxyquinoline aluminum (Alq3), or the like. The organic emission layer 23 formed of the low molecular organic material may be formed using a vacuum evaporation method.

When the organic emission layer 23 is formed of a high molecular organic material, the organic emission layer 23 may generally have a structure including an HTL and an EML. Here, the HTL may be formed of poly(3,4-ethylenedioxythiophene) (PEDOT), and the EML may be formed of a poly-Phenylene vinylene (PPV)-based high molecular organic material or a polyfluorene-based high molecular organic material, and the HTL and the EML may be formed using a screen printing method or an inkjet printing method.

However, the present invention is not limited thereto, and the above-described organic emission layer 23 may be formed of various other suitable materials or may be formed using any of various other suitable methods.

A porous member 26 is formed in the second insulating layer 24.

The porous member 26 may be formed of a gas adsorption material. The porous member 26 may be formed of an oxide or a carbide such as silicon (Si), Ti, Al, or Zn. In more detail, the porous member 26 may be formed of a silicon oxide, a titanium oxide, an aluminum oxide, or a zinc oxide that have suitable porosity. The porous member 26 may also be formed of a silica-based material such as SiC having high mechanical characteristics, a wide bandgap, and chemical stability.

The porous member 26 has a large surface area, and thus, may easily adsorb gas. The porous member 26 may be used as a high temperature heat blocking layer due to its high resistance and low heat conductivity.

Also, the porous member 26 may be an organic/inorganic composite that may be made by inserting an organic material capable of forming pores into an inorganic matrix.

When the first insulating layer 18 and/or the second insulating layer 24 are/is formed of an organic material, the porous member 26 may adsorb the gas discharged from the organic material, and thus, the porous member 26 may reduce or prevent degradation of the organic light-emitting device 20 due to the gas. Also, the porous member 26 may reduce or prevent the second insulating layer 24 from being exfoliated by the first insulating layer 18 due to the gas.

The porous member 26 may be formed of a material having a low refractive index, and thus, the porous member 26 may provide a diffusion effect to light emitted from the organic emission layer 23 toward the second insulating layer 24 so as to further increase an emission efficiency of the organic light-emitting device 20.

The porous member 26, as illustrated in FIG. 1, may be formed on the same layer the first electrode 21 is formed, that is, on the first insulating layer 18. The porous member 26 may be covered by the second insulating layer 24. Thus, three surfaces of the porous member 26, except for a surface of the porous member 26 contacting the first insulating layer 18, may contact the second insulating layer 24. Thus, the porous member 26 may easily adsorb the gas discharged from the second insulating layer 24.

In addition, the porous member 26 may be completely buried in the second insulating layer 24.

Figure 2:
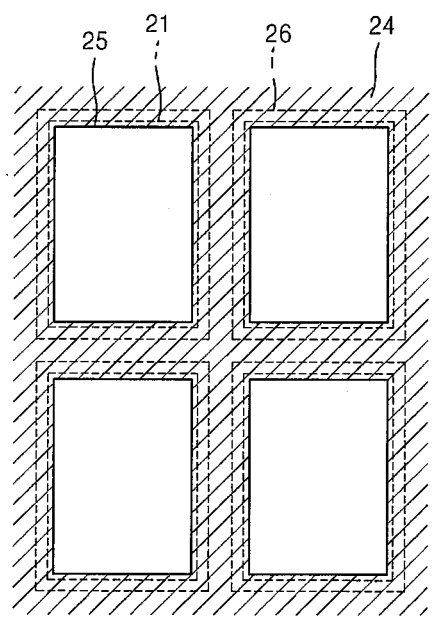
FIG. 2 is a plan view illustrating a pattern of a porous member of the organic light-emitting display device of FIG. 1, according to an embodiment of the present invention.
Figure 3:
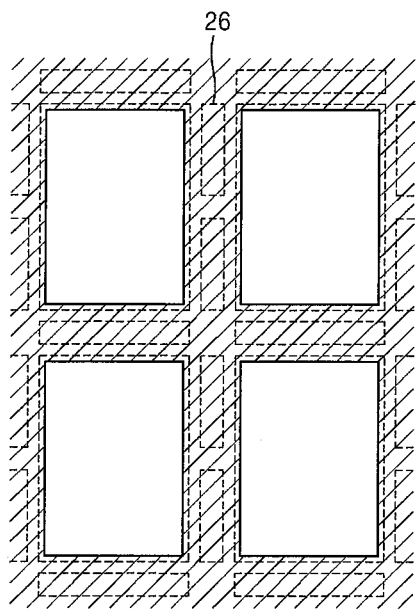
FIG. 3 is a plan view illustrating a pattern of the porous member of the organic light-emitting display device of FIG. 1, according to another embodiment of the present invention.

The porous member 26 may be formed to surround each pixel. That is, as illustrated in FIG. 2, the porous member 26 may be formed to surround the first electrode 21. In this case, the porous member 26 may be formed as a rectangular loop to surround the first electrode 21, as illustrated in FIG. 2, or may be formed discontinuously to surround the first electrode 21, as illustrated in FIG. 3. Although not shown in the drawings, the porous member 26 may contact a part of a side surface of the first electrode 21.

Figure 4:
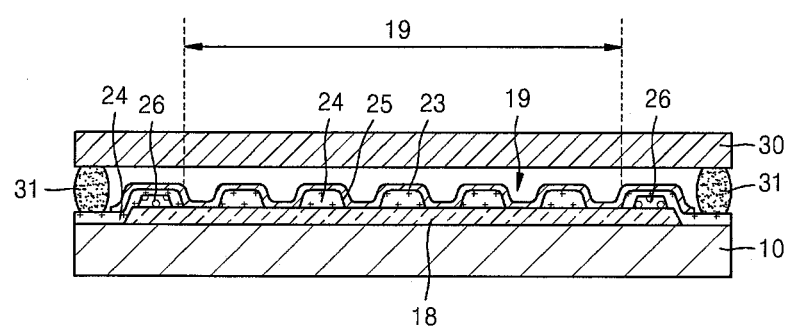
FIG. 4 is a schematic cross-sectional view illustrating an organic light-emitting display device according to another embodiment of the present invention.

FIG. 4 is a schematic cross-sectional view illustrating an organic light-emitting display device according to another embodiment of the present invention.

Referring to FIG. 4, an organic emission unit 19, including a plurality of organic light-emitting devices, is disposed approximately in a central area of the substrate 10.

The organic emission unit 19 includes a plurality of pixels such as the one illustrated in FIG. 1, that is, the organic emission unit 19 includes a plurality of the organic light-emitting devices 20.

The organic emission unit 19 is formed on the first insulating layer 18, and the second insulating layer 24 is formed in the organic emission unit 19 and at an outer area thereof.

Sealants 31 are formed in an outer area of the organic emission unit 19, and a sealing substrate 30 is adhered to the sealant 31 to be coupled to the substrate 10.

In FIG. 4, the second insulating layer 24 extends between the sealant 31 and the substrate 10, but the present invention is not limited thereto. The second insulating layer 24 may not be formed in a portion between the sealant 31 and the substrate 10, i.e., may not extend between them, and the sealant 31 may be directly formed on the substrate 10.

In this structure, the porous member 26 may be formed in a non-emission area formed outside of the organic emission unit 19. Here, the porous member 26 is formed in the second insulating layer 24.

The porous member 26, as illustrated in FIG. 4, may be formed on the first insulating layer 18, and may be covered by the second insulating layer 24. Thus, three surfaces of the porous member 26, except for a surface of the porous member 26 contacting the first insulating layer 18, may contact the second insulating layer 24. Although not shown in the drawings, when the organic light-emitting display device is a passive matrix type display in which the thin-film transistor T is not formed for each pixel, as illustrated in FIG. 1, the first insulating layer 18 may be omitted, and the porous member 26 may be formed on the substrate 10 and may be covered by the second insulating layer 24. As the embodiment described above with reference to FIG. 1, the porous member 26 may be completely buried in the second insulating layer 24.

Figure 5:
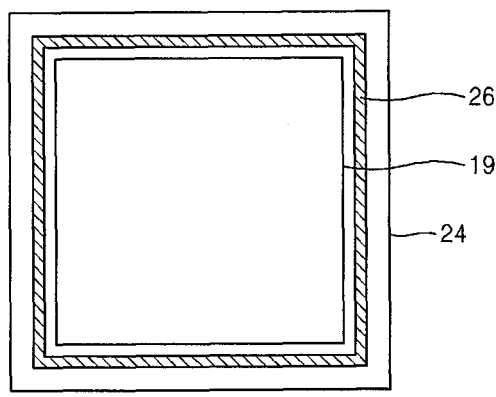
FIG. 5 is a schematic plan view illustrating a pattern of a porous member of the organic light-emitting display device of FIG. 4, according to an embodiment of the present invention.
Figure 6:
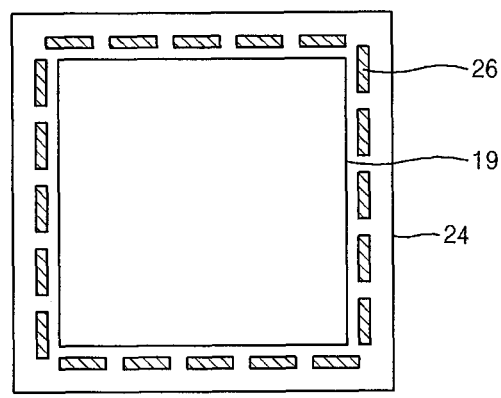
FIG. 6 is a plan view illustrating a pattern of a porous member of the organic light-emitting display device of FIG. 4, according to another embodiment of the present invention.

FIG. 5 is a schematic plan view illustrating a pattern of the porous member 26 of the organic light-emitting display device of FIG. 4, according to an embodiment of the present invention. The porous member 26 may be formed to surround the organic emission unit 19. Here, the porous member 26 may be formed to completely surround the organic emission unit 19 as a rectangular loop, as illustrated in FIG. 5, or may be formed to surround discontinuously, as illustrated in FIG. 6.

The porous member 26, as illustrated in FIG. 4, may be formed at an inner side of the sealants 31.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light-emitting display device comprising:
a substrate;
a thin-film transistor on the substrate;
a first insulating layer covering the thin-film transistor;
a first electrode on the first insulating layer, and electrically connected to the thin-film transistor;
a second insulating layer on the first insulating layer, covering the first electrode, and having an opening for exposing a part of the first electrode;
a porous member in the second insulating layer, the second insulating layer having a thickness greater than a thickness of the porous member;
a second electrode on the second insulating layer, and facing the first electrode so as to correspond to the opening; and
an organic emission layer between the first electrode and the second electrode so as to correspond to the opening,
wherein three surfaces of the porous member, except for a surface of the porous member contacting the first insulating layer, contact the second insulating layer and
wherein the porous member is on the first insulating layer.

2. The organic light-emitting display device of claim 1, wherein the porous member surrounds the first electrode.

3. The organic light-emitting display device of claim 2, wherein the porous member continuously surrounds the first electrode.

4. The organic light-emitting display device of claim 2, wherein the porous member surrounds the first electrode.

5. The organic light-emitting display device of claim 1, wherein the porous member is formed of an oxide or a carbide of a material selected from the group consisting of silicon (Si), titanium (Ti), aluminum (Al), zinc (Zn), and a combination thereof.

6. An organic light-emitting display device comprising:
a substrate;
a thin-film transistor on the substrate;
a first insulating layer covering the thin-film transistor;
a first electrode on the first insulating layer, and electrically connected to the thin-film transistor;
a second insulating layer contacting the first insulating layer, covering the first electrode, and having an opening for exposing a part of the first electrode;
a porous gas adsorption member in the second insulating layer;
a second electrode on the second insulating layer, and facing the first electrode so as to correspond to the opening; and
an organic emission layer between the first electrode and the second electrode so as to correspond to the opening.

* * * * *

UNITED STATES PATENT AND TRADEMARK OFFICE
CERTIFICATE OF CORRECTION

PATENT NO.       : 8,624,259 B2                                    Page 1 of 1
APPLICATION NO.  : 13/244135
DATED            : January 7, 2014
INVENTOR(S)      : Lee et al.

It is certified that error appears in the above-identified patent and that said Letters Patent is hereby corrected as shown below:

In the Claim

Col. 7, line 2, Claim 4        Delete "member surrounds",
                               Insert --member discontinuously surrounds--

Signed and Sealed this
Third Day of February, 2015

Michelle K. Lee
*Deputy Director of the United States Patent and Trademark Office*